Aug. 29, 1967 W. C. PASSARO 3,339,158

CASCADED MULTI-PORT JUNCTION CIRCULATOR

Filed Jan. 19, 1966

2 Sheets-Sheet 1

INVENTOR.
WILLIAM C. PASSARO
BY
John H. Gallagher
ATTORNEY

INVENTOR.
WILLIAM C. PASSARO
BY
John H. Gallagher
ATTORNEY

United States Patent Office 3,339,158
Patented Aug. 29, 1967

3,339,158

CASCADED MULTI-PORT JUNCTION CIRCULATOR

William C. Passaro, Dunedin, Fla., assignor to Sperry Rand Corporation, a corporation of Delaware Filed Jan. 19, 1966, Ser. No. 521,567
4 Claims. (Cl. 333—1.1)

ABSTRACT OF THE DISCLOSURE

A multi-port circulator comprised of a plurality of individual strip line junction circulators connected in cascade. The multi-port circulator includes two parallel ground plane conductors and a center strip conductor having a pattern in the form of cascaded multi-port junctions. A pair of ferrite plates are positioned between the ground plane conductors and the center strip conductor. The ferrite plates extend completely throughout and between the regions occupied by the junctions and for an appreciable distance along all of transmission paths leading to each junction.

Figure 1:
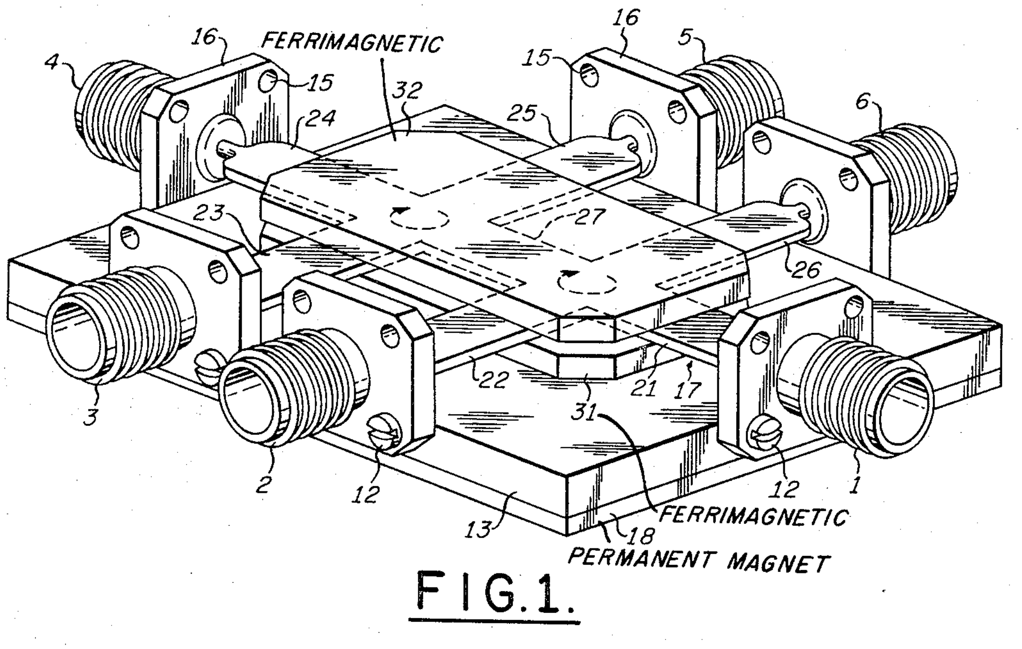

This invention relates to electromagnetic wave circulator devices of the types that are formed of cascaded multi-port junctions in which magnetized ferrimagnetic material is employed to produce the circulating action. More particularly, the invention is concerned with the ability to make a smaller and less expensive cascaded junction circulator by employing ferrimagnetic material completely throughout and between the regions of the device that are occupied by the cascaded junctions.

Three port circulators in the form of symmetrical Y-junctions and four port circulators in the form of a junction having 90° symmetry have found considerable use in electromagnetic wave circuits and systems for providing nonreciprocal wave propagating paths. One use to which symmetrical junction circulators have been put has been in connection with one port parametric and tunnel diode amplifiers that operate in a reflecting mode. That is, the signal that is to be amplified is coupled into the single signal port of the amplifier, is amplified, and is reflected back out the same port. A circulator coupled to the single port provides separate and distinct transmission paths for the input and amplified output signal waves. To successfully use such a combination of a circulator and amplifier, the isolation provided by the circulator between the input and output signal paths must considerably exceed the gain of the amplifier in order to avoid unstable operation of the amplifier and to assure a relatively flat gain vs. frequency characteristic of the amplifier. It therefore is required that, so far as reflected waves are concerned, the amplifier must be well isolated from the load and from the signal source. A circulator comprised of a single symmetrical junction that is loaded with ferrimagnetic material often is unable to provide the isolation that is required and to improve the isolation it has become common practice to cascade two or more symmetrical junction circulators. The total isolation in dbs now is the sum of the isolations provided by the individual circulators.

To obtain proper circulator action, which includes the proper isolation, each of the ports of the circulator must be properly matched into the ferrite loaded junction. In the prior art circulators of the type being discussed, the ferrite material is confined to a localized region, usually at the axis of symmetry of the junction. In a junction formed of TEM mode transmission lines, the ferrimagnetic material is in the form of two small discs which are centered on opposite sides of the common junction. Because of the presence of the ferrimagnetic material in the junction, the impedance of the junction usually is considerably lower than the impedance of the sections of transmission line that connect the junction to the various ports. To match the ports to the junction, it has become common practice to add a matching transformer structure in each line between the junction and a respective port. When circulators are cascaded to obtain high isolation, sufficient space must be provided in the sections of transmission line that join the junctions to permit the insertion of the necessary impedance matching transformer structures. Not only does this add to the size and weight of the device and complicate its design, but the adjustments and tuning of the matching structures to obtain the desired operating conditions is tedious and difficult, and often the operation of the device is still erratic due to the many variables that exist in the device. In a physical sense, the devices are somewhat difficult to construct because, in addition to the matching structures, two separate ferrimagnetic discs must be placed at each one of the cascaded junctions.

It therefore is an object of this invention to provide an electromagnetic wave circulator comprised of a plurality of cascaded multi-port junctions which is small in size, light in weight, simple to construct, and superior in operation.

In accordance with the illustrated TEM mode transmission line embodiments of the present invention, a circulator structure is comprised of two parallel spaced-apart ground plane conductors between which is positioned a center strip conductor having a pattern in the form of cascaded, or successively connected, multi-port symmetrical junctions. Positioned respectively between the ground plane conductors and the center strip conductor are a pair of ferrimagnetic members that extend completely throughout and between the regions occupied by the junctions. In this manner the ferrimagnetic material is everywhere in the junctions and in the transmission line paths therebetween so as to provide substantially the same magnitude of impedance for the junctions and the connecting sections of transmission line. Therefore, no separate impedance matching transformer structures are required in the connecting sections of line. Physically this means that the device may be made smaller and lighter, and it is considerably simpler to construct because only two members of ferrimagnetic material are required regardless of the number of junctions that are cascaded. This latter advantage may be contrasted to the prior art devices where two ferrimagnetic members are required for each one of the junctions.

Figure 2:
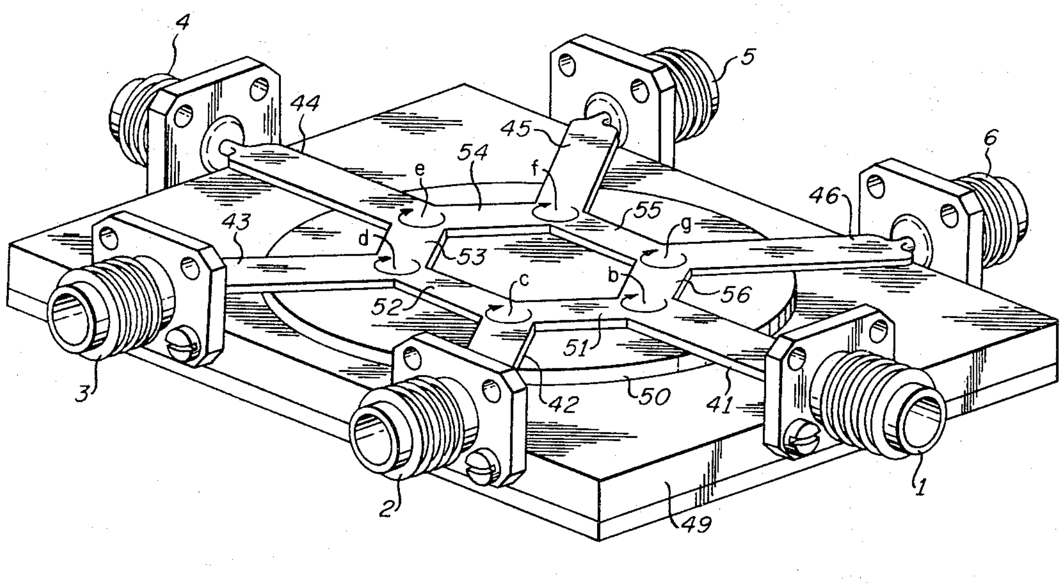
Figure 3:
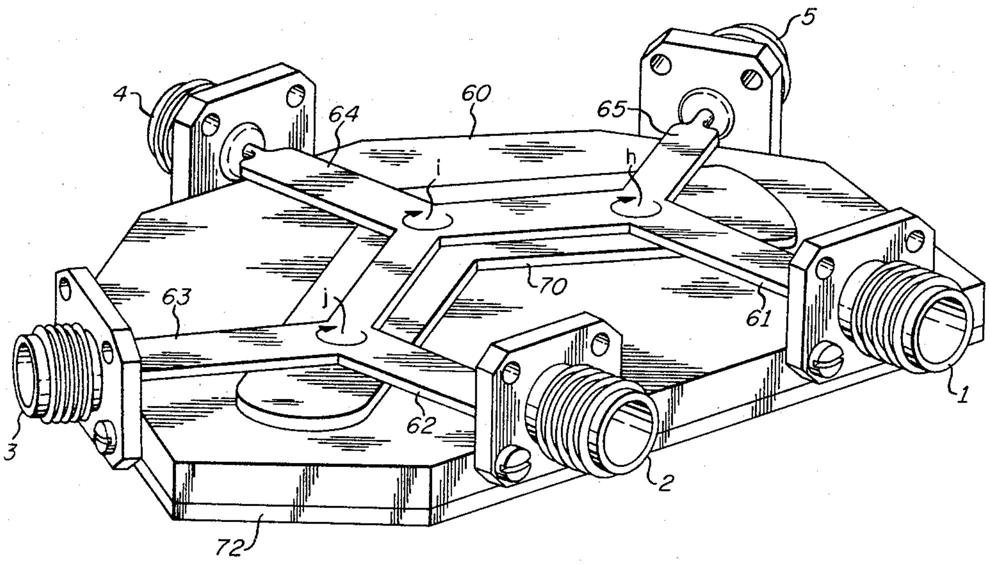

The invention will be described by referring to the accompanying drawings wherein:

FIG. 1 is an illustration of a six port circulator formed by two cascaded symmetrical 90° junctions having a pair of flat polygonal shaped slabs of ferrimagnetic material positioned completely throughout and between the two junctions;

FIG. 2 is another embodiment of the present invention illustrating a six port circulator formed of six cascaded symmetrical Y-junctions that form a closed circular pattern and in which the ferrimagnetic material is in the form of two discs that cover the circular pattern on the respective sides; and FIG. 3 is an illustration of the present invention employed in a five port circulator comprised of three cascaded symmetrical Y-junction circulators.

Referring now in detail to FIG. 1 of the drawings, the multi-port circulator device includes the coaxial line connectors 1–6 that provide electrical connection to external circuitry and devices. In this discussion, coaxial line connectors 1–6 will be considered as the six ports of the circulator device. The connectors are physically secured by means of screws 12 to a flat bottom ground plane conductor 13. A top ground plane conductor, which is not illustrated for purposes of clarity, extends in parallel relationship to the bottom ground plane conductor 13 and is secured to the coaxial line connectors by screws that pass through the holes 15 at the upper portions of the backing plates 16 of the respective connectors.

Positioned symmetrically between the ground plane conductors is a center strip conductors 17 which is comprised of a plurality of narrow strip conductors 21–27 that lie in a common plane and are joined together in a manner to form a pattern of two crosses, these forming two symmetrical 90° strip transmission line junctions that are electrically connected in cascade. That is, conductive center strips 21, 22, 26 and 27 form a first symmetrical 90° junction and conductors 23, 24, 25 and 27 form the second junction, it being evident that the conductor 27 is common to both junctions and forms the cascading electrical connection therebetween. Strip conductors 21–26 are connected at their outer ends to the respective coaxial line connectors 1–6. As is well understood in the art, the strip transmission line device of FIG. 1 propagates electromagnetic waves in a TEM mode.

Positioned between the bottom ground plane conductor 13 and the bottom surface of center strip conductor 17 is a flat slab 31 of ferrimagnetic material that presents gyromagnetic effects to the electromagnetic waves. A second substantially identical slab 32 is positioned between the top surface of center strip conductor 17 and the bottom surface of the upper ground plane conductor which is not illustrated. As is evident from FIG. 1, the slabs 31 and 32 of ferrimagnetic material are disposed beneath and above the two junctions of the center strip conductors, and additionally they extend completely between the junctions so that electromagnetic waves that propagate in and between the junctions propagate through the ferrimagnetic material. The composition of the slabs 31 and 32 may be any of the materials that have become well known for use in circulator devices. For example, the rare earth substituted yttrium iron garnet materials have become quite popular for use in these devices.

As is conventional in symmetrical junction circulators, ferrimagnetic slabs 31 and 32 will be magnetized to a desired magnetization state in a direction transverse to their broad flat surfaces. The magnetizing field may be provided by a pair of permanent magnets that are in the shape of slabs, such as the magnet 18, and which are secured to the outer surfaces of the two ground plane conductors. The magnets are permanently magnetized in a direction transverse to their broad surfaces to provide the desired direction of magnetization for the ferrimagnetic slabs 31 and 32.

The device of FIG. 1 operates in the conventional manner of cascaded junction circulators, the direction of circulation of electromagnetic waves being indicated by the circularly shaped arrows that are located at the two junctions.

Multi-port cascaded junction circulators that were constructed in the past employed at each junction a pair of small discs, or sometimes triangles of ferrimagnetic material that were on the two sides of the center strip conductor. The presence of the ferrimagnetic material only in a junction region caused the junction to present a low impedance to electromagnetic waves. On the other hand, the section of transmission line that joined two cascaded junctions was free of ferrimagnetic material and thus presented a higher value of impedance to the waves. To achieve proper circulating operation an impedance match had to be provided between the junctions and the connecting transmission line, and this customarily was done by inserting impedance transformers in the connecting section of transmission line. Thus, a pair of ferrimagnetic members and impedance transformers were required for each one of the cascaded junctions. This complicated the design and construction of the device and made it more difficult to attain and maintain the desired operating characteristics of the device. In the device of the present invention, however, because ferrimagnetic slabs 31 and 32 are disposed within both of the junctions and extend completely between the two junctions, waves that propagate between the junctions on center strip conductor 27 will "see" substantially the same transmission line impedance that is presented to them at the junctions. Therefore, no additional matching transformer sections are required in the center strip conductor 27 and it may be of minimum length. This feature not only reduces the size and weight of a multi-port circulator device but also considerably simplifies its construction.

Another embodiment of a multi-port cascaded junction circulator that employs two members of ferrimagnetic material each of which lies within all of the multiple junctions and also within the transmission line paths therebetween is illustrated in simplified form in FIG. 2. This six port circulator is comprised of six cascaded symmetrical Y-junction circulators. Coaxial line connectors 1–6 provide the connections from the six ports to external circuits and device, and these ports are connected by means of the strip conductors 41–46 to each of the respective symmetrical Y-junctions *b–g*. Strip conductors 51–56 serve both as arms of two adjacent Y-junctions and as the connecting transmission lines therebetween. The bottom ground plane conductor 49 is physically secured to each of the coaxial line connectors 1–6, and the narrow strip conductors 41–46 and 51–56 comprise the center strip conductor of the TEM mode device. The top ground plane conductor is not shown in order to simplify the drawing. As is understood, the top ground plane conductor will be disposed in parallel relationship to the bottom ground plane conductor 49 and the center strip conductors will be symmetrically positioned between the two ground plane conductors.

A flat disc 50 of ferrimagnetic material is disposed between the bottom ground plane conductor 49 and the pattern of narrow strip conductors that form the center conductors of the device. A second flat disc of ferrimagnetic material, which is not illustrated for purposes of clarity, will be placed between the top surface of the pattern of the center strip conductors and the bottom surface of the top ground plane conductor. Suitable magnetizing means such as permanent magnets, not illustrated, are provided to magnetize the ferrimagnetic discs in a direction transverse to their flat circular surfaces.

The six symmetrical Y-junctions *b–g* each functions in a well known manner to provide a circulating action, assumed here to be in the clockwise direction, for electromagnetic waves that may be coupled to any one of the ports 1–6. Multi-port circulators having center strip conductors with the same pattern illustrated in FIG. 2 are known to those skilled in the art and its operation will not be further described.

Because the ferrigmagnetic material in the two discs extends below and above each of the symmetrical Y-junctions and also extends completely between the cascaded junctions, the need for matching transformer sections between the junctions again is obviated. This means that the sections 51–56 of the center strip conductors that form the interconnections between the junctions may be of minimum length to reduce the size and weight of the TEM mode device. Additionally, only two ferrimagnetic discs are required rather than the six pairs that would have been employed at the respective junctions if the device had been constructed in accordance with the prior art practices. This obviously simplifies the construction of the device.

A five port cascaded junction circulator that is constructed in accordance with the teachings of this invention is illustrated in simplified form in FIG. 3. In this embodiment, coaxial line connectors 1–5 comprise the five ports of the device and the conductive plate 60 forms the bottom ground plane conductor of the TEM mode device.

Narrow strip conductors 61–65 provide connections between the respective coaxial line connectors 1–5 and the cascaded symmetrical Y-junctions *h, i* and *j*. A thin flat angularly shaped slab of ferrimagnetic material 70 is positioned between the bottom ground plane conductor 60 and the planar pattern of narrow strip conductors that form the cascaded junctions. The second ground plane conductor and a second angularly shaped slab of ferrimagnetic material which will be positioned symmetrically above the junctions formed by center strip conductors have been omitted from the drawing for purposes of clarity. Again in this embodiment of the invention, just two ferrimagnetic slabs are utilized above and below, and between, the junctions. A pair of permanent magnets, such as illustrated magnet 72, will provide the transversely directed magnetizing field to magnetize the ferrimagnetic material.

The circulating action of the device of FIG. 3 will be conventional, each junction producing a circulating action in the clockwise direction, as illustrated by the circularly-shaped arrows that are located at the junctions.

It is well known to those in the art that there are a number of diverse arrangements of multi-port cascaded junction circulators, and in most if not all of these devices the construction may be simplified and the operating performance improved by employing a single pair of ferrimagnetic members rather than the plurality of pairs of ferrigmagnetic members that commonly have been employed in the prior art devices of this type. While the present invention has been illustrated and described in TEM mode transmission line devices, the same principles are useful in hollow waveguide cascaded junction circulators.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A multi-port strip line cascaded junction circulator comprising a ground plane conductor and a branched center strip conductor, said ground plane conductor and said branched center strip conductor further defining a plurality of strip line junction circulators, each of said circulators having a ferrimagnetic member and a plurality of ports, one port of each circulator being connected to one port of another circulator thereby to electrically connect said circulators in cascade and form said branched center strip conductor, each said ferrimagnetic member being a portion of a single ferrimagnetic member located between said ground plane conductor and said branched center strip conductor and extending completely throughout and between the regions occupied by said circulators and for an appreciable distance along all transmission paths leading to each circulator port, said ferrimagnetic member being adapted to be magnetically biased to produce a circulating action for electromagnetic waves at each of said circulators.

2. A multi-port cascaded junction circulator as defined in claim 1 and further including means for magnetically biasing said ferrimagnetic member to produce a circulating action for electromagnetic waves at each of said junction circulators.

3. A multi-port cascaded junction circulator as defined in claim 1 wherein a pair of ground plane conductors are positioned about said branched center strip conductor, and a pair of ferrimagnetic members are positioned between said ground plane conductors and said branched center strip conductor.

4. A multi-port cascaded junction circulator as defined in claim 3 and further including means for magnetically biasing said ferrimagnetic members to produce a circulating action for electromagnetic waves at each of said junction circulators.

References Cited

UNITED STATES PATENTS 2,794,172 5/1957 Kock ---------------- 333—1.1

HERMAN KARL SAALBACH, *Primary Examiner.*

ELI LIEBERMAN, *Examiner.*

P. L. GENSLER, *Assistant Examiner.*